(12) United States Patent
Kobayashi et al.

(10) Patent No.: US 6,690,257 B2
(45) Date of Patent: Feb. 10, 2004

(54) COMMON MODE CHOKE COIL

(75) Inventors: Osamu Kobayashi, Iwata-gun (JP); Yukio Suzuki, Iwata-gun (JP); Kiyoshi Ito, Iwata-gun (JP)

(73) Assignee: Minebea Co., Ltd., Miyota-machi (JP)

( * ) Notice: Subject to any disclaimer, the term of this patent is extended or adjusted under 35 U.S.C. 154(b) by 22 days.

(21) Appl. No.: 10/026,631

(22) Filed: Dec. 27, 2001

(65) Prior Publication Data
US 2002/0080001 A1 Jun. 27, 2002

(30) Foreign Application Priority Data
Dec. 27, 2000 (JP) .................................. 2000-398526

(51) Int. Cl.[7] .............................................. H01F 27/28
(52) U.S. Cl. ...................... 336/229; 336/208; 336/198; 336/192
(58) Field of Search ...................... 336/192, 83, 200, 336/212, 198, 223, 229, 208

(56) References Cited

U.S. PATENT DOCUMENTS

| | | | |
|---|---|---|---|
| 4,603,314 A | * | 7/1986 | Fukunaga et al. ............. 336/65 |
| 4,765,861 A | * | 8/1988 | Curtis, Jr. et al. ........... 156/457 |
| 6,246,311 B1 | * | 6/2001 | Finnemore et al. .......... 336/192 |
| 6,480,088 B2 | * | 11/2002 | Okamoto ...................... 336/229 |

FOREIGN PATENT DOCUMENTS

| | | | |
|---|---|---|---|
| JP | 59 210619 A | | 11/1984 |
| JP | 60 204110 A | | 10/1985 |
| JP | 361144007 A | * | 7/1986 |
| JP | 06 283341 A | | 10/1994 |
| JP | 407153629 A | * | 6/1995 |
| JP | 410149921 A | * | 6/1998 |
| JP | 2000323337 A | * | 11/2000 |

* cited by examiner

*Primary Examiner*—Anh Mai
(74) *Attorney, Agent, or Firm*—Oliff & Berridge, PLC

(57) ABSTRACT

A common mode choke coil is described that is capable of providing improved characteristics at high frequencies. A bobbin having a toroidal core is mounted on a base. One coil is wound around one half of the bobbin and another coil is wound around the other half thereof. Both ends of each of the coils are connected to corresponding terminals provided on the base. The one coil has its one end connected to one of the terminals, is wound around one half of the bobbin from one side of the bobbin, finishes above the bobbin, that is, at the inner circumference of a core, leads out toward the other terminal provided on the base travelling along the outer face of a plate vertically mounted on the other side of the bobbin, and is connected to the terminal. The same applies to the other coil.

9 Claims, 10 Drawing Sheets

COMMON MODE CHOKE COIL

BACKGROUND OF THE INVENTION

1. Field of the Invention

The present invention relates to a common mode choke coil. More specifically, the present invention relates to a structure of a common mode choke coil capable of providing improved characteristics at high frequencies.

2. Description of the Related Art

An alternating current (AC) power supply line constitutes a route through which external noises flow into an electronic apparatus or noises generated inside an electronic apparatus flow out. A choke coil is therefore inserted in series with the AC power supply line for cutting off the noises. There are two types of noises; a normal mode noise generated between lines and a common mode noise generated in both lines relating to the ground, and in general the common mode noise causes problems. It is required that a common mode choke coil for removing the common mode noise have a large inductance for the common mode noise and that magnetic fluxes cancel out each other for the AC voltage of a commercial power supply.

When a toroidal core is used as a magnetic core of the common mode choke coil, bifilar winding in which two wires are wound together generates little leakage flux. However, since insulation between the wires must be considered when a high voltage is applied therebetween and since also line capacitance between the wires must be considered in order to obtain preferable characteristics at high frequencies, the two wires must be wound apart from each other prohibiting the use of the bifilar winding. Accordingly, in general, one wire is wound around one half of the toroidal core, and another wire is wound around the other half thereof such that the both wires are wound equally so that respective magnetic fluxes cancel out each other relative to a normal mode current.

FIGS. 9 and 10 show conventional common mode choke coils. FIG. 9 is a perspective view of a conventional toroidal common mode choke coil of vertical type. FIG. 10 is a perspective view of a conventional toroidal common mode choke coil of horizontal type. In FIGS. 9 and 10, a plastic insulating partition 90 is arranged across a center opening of a plastic insulating case (hereinafter, referred to as a bobbin) 95 housing a toroidal core, and two coils 93 and 94 are wound in the same direction so as to sandwich the plastic insulating partition 90. The magnetic core is mounted vertically on a plastic base 91 in FIG. 9, and horizontally in FIG. 10. The two coils lead out from respective corresponding terminals 92a and 92b, and 92c and 92d (92d not shown) via respective corresponding through-holes 93b and 94b formed in the plastic base 91 and two other holes (not shown) formed in symmetric relation thereto in the base 91. Terminations of the coils 93 and 94 are connected to the respective corresponding terminals 92a and 92b, and 92c and 92d. To be specific, one termination of one coil wound around one half of the bobbin 95 is connected to the terminal 92a and the other termination thereof is connected to the terminal 92b. Similarly, one termination of the other coil wound around the other half of the bobbin 95 is connected to the terminal 92d (not shown) and the other termination thereof is connected to the terminal 92c.

The coils are wound around the bobbin 95 which is shown in an exploded view in FIG. 11. More specifically, the bobbin 95 is configured in such a manner that a toroidal core 113 is housed in a cylinder 114 composed of an insulating material and having an opening 112 at the center thereof and a cover 110 is fitted thereto. One of the two coils is wound around one half of the bobbin 95 having a configuration described above and the other coil is wound around the other half thereof such that the both coils are wound equally so that respective magnetic fluxes cancel out each other relative to a normal mode current.

Typically, in the bobbin 95, a partition 90 is inserted separating the both coils in order to improve the withstand voltage therebetween. The cylinder 114 and the cover 110 have respective fitting mechanisms 115, and 115' and 115" for fitting the partition 90 thereto.

The vertical type toroidal common mode choke coil shown in FIG. 9, which can save an installation area, is generally used in a circuit board,.

FIG. 12 is a sectional view for explaining problems in the vertical type toroidal common mode choke coil. In FIG. 12, the bobbin 95 is mounted on the base 91 and the coil 93 is wound with a regular interval around one half of the bobbin 95. One termination of the coil 93 is connected to the terminal 92b, and the other termination is connected to the terminal 92a. Parts 12A and 12B of a toroidal core 12 are shown at a section of the bobbin 95. The coil 93 is shown only at its starting and finishing ends.

In such a configuration, the coil 93 starting from the terminal 92b provided on the base 91 located under the bobbin 95, that is, toward the part 12B of the core 12, is wound all the way around the half of the bobbin 95. The coil 93 then passes diagonally through the center opening of the bobbin 95 from upper part of the bobbin 95, that is, the part 12A, toward the terminal 92a provided on the base 91, when travelling from one end face of the bobbin 95 to the other end face thereof, and terminates there to be connected to the terminal 92a.

In the aforesaid case, a starting end part A of the coil 93 is disposed in contact with or close to the bobbin 95, and a finishing end part C is disposed in contact with or close to a portion of the bobbin 95 where the coil 93 starts (hereinafter, referred to as beginning of the coil) in order to prevent both starting and finishing end parts of the coil 93 from getting damaged by a vibration or contact. However, in such an arrangement, the following problems arise. Referring to FIG. 13, the problems will be described.

FIG. 13 is an electrical equivalent circuit of the arrangement of FIG. 12. The coil 93 includes an input terminal XA and an output terminal XB, and the coil 94 includes an input terminal YA and an output terminal YB. Both the coils 93 and 94 are wound around the toroidal core 12, and have inductances ZLX and ZLY, respectively. The stray capacitance (hereinafter, referred to as a capacitance) of each part will be defined as follows.

Reference symbol $CL_1$ denotes a capacitance between the inputs of the coils 93 and 94. Reference symbol $CL_2$ denotes a capacitance between the outputs of the coils 93 and 94. Reference symbols $C_1X$ and $C_2X$ denote capacitances generated due to the finishing end part C of the coil 93 disposed close to or in contact with a beginning of the coil 93, as shown in FIG. 12. Similarly, reference symbols $C_1Y$ and $C_2Y$ denote capacitances generated due to the finishing end part C of the coil 94 disposed close to or in contact with a beginning of the coil 94.

Other symbols $CS_1$, $CS_2$, $CS_3$, $CS_4$, $CS_5$, $CS_6$ and $CS_7$ denote line capacitances between the coils.

The common mode choke coil is inserted in series with an AC power supply line in order to cut off a noise. More specifically, the terminals XA and YA are used as input terminals and the terminals XB and YB are used as output terminals. When the terminals XA and YA are connected to each other to form a terminal XYA and the terminals XB and YB are connected to each other to form a terminal XYB, it is preferred that an impedance ZAB between the both connection terminals be large with respect to the common mode noise.

As is evident from FIG. 13, the impedance ZAB between the both connection terminals is not influenced by the capacitances $CL_1$ and $CL_2$, and becomes an impedance ZAB of the circuit, which is connected in parallel with the inductance ZLX of the coil 93 and the inductance ZLY of the coil 94, the capacitances $C_1X$, $C_2X$, $C_1Y$ and $C_2Y$, and the capacitances $CS_1$, $CS_2$, $CS_3$, $CS_4$, $CS_5$, $CS_6$ and $CS_7$. In such a circuit, the inductances ZLX and ZLY are dominant at low frequencies, and the capacitances $C_1X$, $C_2X$, $C_1Y$ and $C_2Y$ are dominant at high frequencies. The coils can be wound around the bobbin 95 such that the influence of the capacitances $CS_1$, $CS_2$, $CS_3$, $CS_4$, $CS_5$, $CS_6$ and $CS_7$ can be ignored as a distributed constant circuit, compared with the capacitances $C_1X$, $C_2X$, $C_1Y$ and $C_2Y$.

In other words, the impedance ZAB between the both connection terminals is decreased by the capacitances $C_1X$, $C_2X$, $C_1Y$ and $C_2Y$ at high frequencies, so that the performance of the common mode coke coil with respect to a high-frequency noise is lowered. Accordingly, it is desirable to decrease the capacitances $C_1X$, $C_2X$, $C_1Y$ and $C_2Y$ in order to improve the performance with respect to a high-frequency noise.

FIG. 8 shows an example of frequency characteristics of a toroidal common mode choke coil of vertical type. In FIG. 8, the results are plotted with frequency in abscissa and with the impedance ZAB between the both connection terminals in ordinate. It is found that when the frequency exceeds 10 MHz, the impedance ZAB between the both connection terminals decreases in the conventional toroidal common mode choke coil of vertical type, as shown by reference numeral 82. This is because the influence of the capacitances $C_1X$, $C_2X$, $C_1Y$ and $C_2Y$ appears in the vicinity of 10 MHz and upward. Consequently, by the conventional method, the performance with respect to the common mode noise of 10 MHz or more is lowered.

The capacitances $C_1X$, $C_2X$, $C_1Y$ and $C_2Y$ are generated because the finishing end part C of the coil 93 is disposed in contact with or close to the beginning of the coil 93, as shown in FIG. 12. It is found that the existence of such capacitances lowers the performance of the toroidal common mode choke coil of vertical type at high frequencies. Such a problem that the performance at high frequencies is lowered due to the capacitances generated because of the finishing end part C of the coil 93 staying in contact with or close to the beginning of the coil 93 can be easily avoided in the toroidal common mode choke coil of horizontal type. This is because the input coil and the output coil can be positioned so as to oppose each other as shown in FIG. 10. However, since the choke coil of the horizontal type occupies a substantial area of the circuit board, the parts installation density is decreased, thereby hindering the downsizing of the apparatus.

SUMMARY OF THE INVENTION

Accordingly, it is an object of the present invention to provide a common mode choke coil which solves the above problems and improves characteristics at high frequencies.

In order to achieve the above objects, according to the present invention, in a common mode choke coil, in which one coil is wound around one half of a toroidal core housed in a bobbin and another coil is wound around the other half thereof such that the both coils are wound equally so that respective magnetic fluxes cancel out each other relative to a normal mode current, and in which one end part of each of the coils wound around respective halves of the core leads out toward a portion of the bobbin where the other end part thereof is wound, the one end part is disposed so as not to stay close to the portion of the bobbin where the other end part is wound, thereby reducing capacitances $C_1X$, $C_2X$, $C_1Y$ and $C_2Y$.

In the common mode choke coil, the one end part of the coil may pass through a center opening of the core in a non-diagonal manner when travelling from one end face of the bobbin to the other end face thereof.

In the common mode choke coil, a plate composed of an insulating material may be provided between the one end parts and the coils including the other end parts.

In the common mode choke coil, the plate may be provided with a plurality of notches each for fixedly holding the one end part of each of the coils.

In the common mode choke coil, the plate may be formed of a same insulating material as that of a base on which the common mode choke coil is mounted, and integrated with the base.

In the common mode choke coil, the plate and the base, which are integrated with each other, may be each provided with a plurality of notches each for fixedly holding the one end part of each of the coils.

In the common mode choke coil, the plate may be provided with a plurality of notches each for fixedly holding the one end part of each of the coils, and the base may be provided with a plurality of terminals.

DESCRIPTION OF THE PREFERRED EMBODIMENTS

Figure 1A:
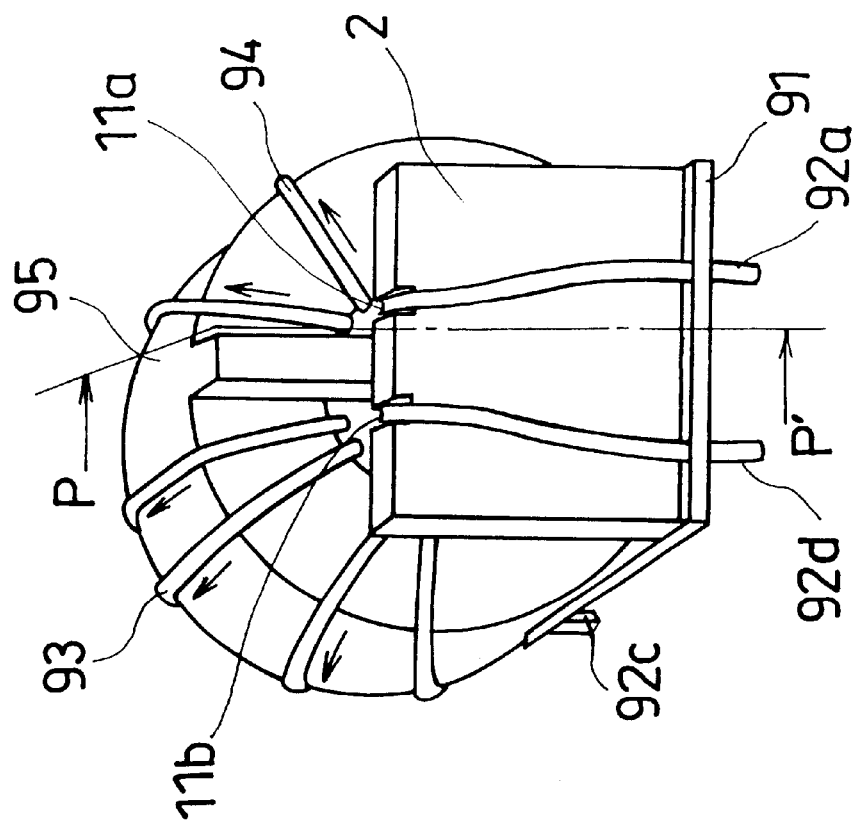
FIGS. 1A and 1B show an embodiment of a toroidal common mode choke coil of vertical type according to the present invention.
Figure 1B:
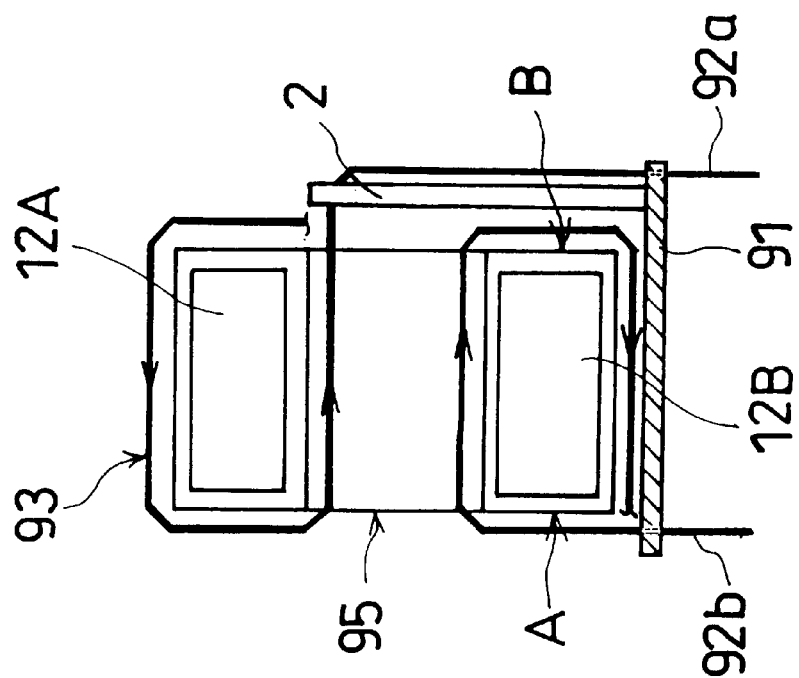
Figure 2:
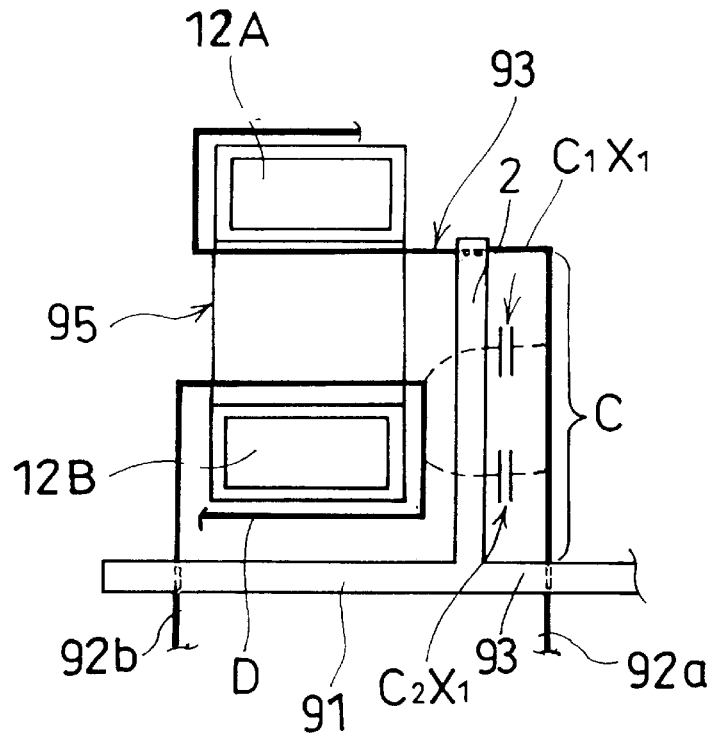
FIG. 2 explains the distribution of capacitances of the toroidal common mode choke coil in FIGS. 1A and 1B.
Figure 3:
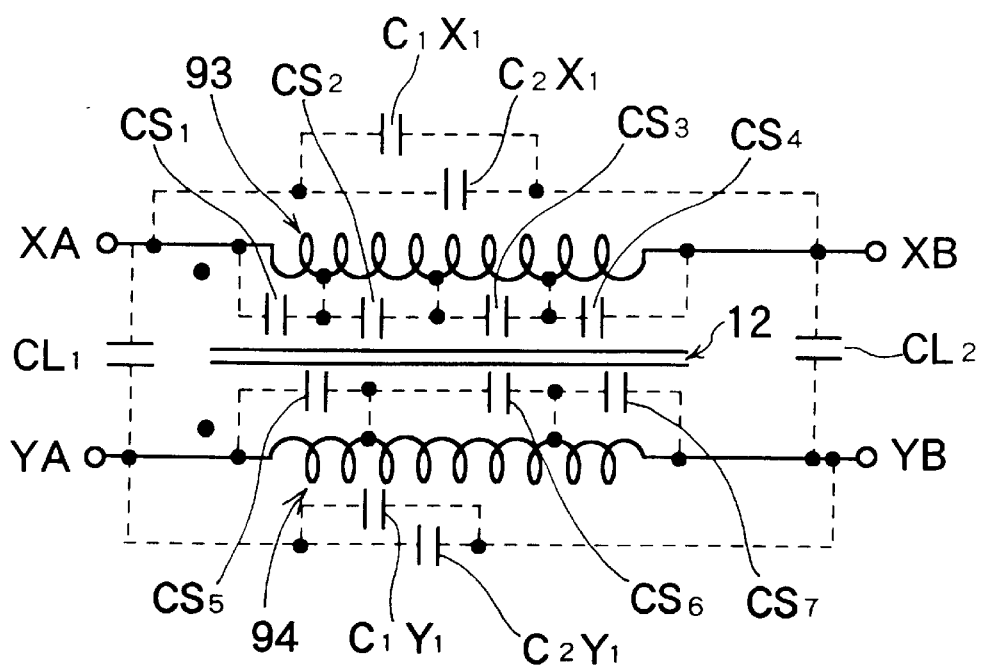
FIG. 3 shows an electrical equivalent circuit of an arrangement in FIG. 2.

Embodiments of the present invention will be described hereinbelow with reference to the drawings. FIGS. 1A and 1B show an embodiment of a toroidal common mode choke coil of vertical type according to the present invention. FIG. 2 explains the distribution of capacitances of the common mode choke coil in FIGS. 1A and 1B. FIG. 3 shows an equivalent circuit of an arrangement in FIG. 2.

FIG. 1A is a perspective view and FIG. 1B is a sectional view taken along line P–P' of FIG. 1A for explaining the relationship between a coil and a bobbin. In FIG. 1A, a plastic insulating partition (not shown) is arranged across a center opening of a bobbin 95 housing a toroidal core and two coils 93 and 94 are wound in the same direction around respective halves of the bobbin 95 so as to sandwich the insulating partition. The coils each lead out via through-holes (not shown) provided in a plastic base 91 and are connected to terminals 92a, 92c, 92d and a 92b (92b not shown). That is, one end of one coil wound around one half of the bobbin 95 is connected to the terminal 92a, and the other end thereof is connected to the terminal 92b (not shown). Similarly, one end of the other coil wound around the other half of the bobbin 95 is connected to the terminal 92d, and the other end thereof is connected to the terminal 92c.

A plate 2 formed of a low-dielectric insulating material is disposed in parallel with the bobbin 95 and perpendicular to the base 91. The plate 2 and the base 91 may be integrally formed using a same insulating material or alternatively, may be separately formed and then put together. The plate 2 includes notches 11a and 11b for fixedly holding end parts of the coils. The base 91 includes the terminals 92a, 92c, 92d and 92b.

The notches 11a and 11b hold fixedly the one end parts of the coils wound around one half and the other half of the bobbin 95, respectively, using a method such as an adhesive agent. The coils lead out along an outer face of the plate 2, that is a face not facing the bobbin 95, go through the through-holes (not shown) and are connected to the terminals 92a and 92d.

FIG. 1B shows the structure of the choke coil in FIG. 1A, simplified for a better clarification. That is, the bobbin 95 is mounted on the base 91, and the coil 93 is wound around the one half of the bobbin 95 with a regular interval. One end of the coil 93 is connected to the terminal 92b, and the other end thereof is connected to the terminal 92a. Parts 12A and 12B of the core 12 are shown at the sectional view of the bobbin 95. The coil 93 is shown only at its starting and finishing end parts.

In such an arrangement, the one end of the coil 93 is connected to the terminal 92b provided on the base 91 located under the bobbin 95, that is, toward the part 12B, and the coil 93 starts at a part A of the bobbin 95 and is wound around the one half of the bobbin 95. The coil 93 finishes at an upper portion of the bobbin 95, specifically one end of the inner circumference at the part 12A, leads out toward the terminal 92a provided on the base 91 travelling along the outer face of the plate 2 which is vertically mounted near a part B of the bobbin 95, and is connected to the terminal 92a.

In the common mode choke coil with the configuration shown in FIGS. 1A and 1B, the plate 2 formed of a low-dielectric insulating material is mounted on the base 91 in parallel with the bobbin 95 and perpendicular to the base 91, the coil 93 finishes at the upper portion of the bobbin 95, that is, toward the end of the inner circumference at the part 12A of the core 12, leads out toward the terminal 92a provided on the base 91 travelling along the outer face of the plate 2, and is connected to the terminal 92a. Since the coil 93 wound around the one half of the bobbin 95 leads out passing through the center opening of the bobbin 95 in a non-diagonal manner, an accurate inductive capacity can be obtained even in a common mode choke coil having a small number of turns, and at the same time noises generated from the coil can be decreased. The distribution of capacitances in such an arrangement is shown in FIG. 2. That is, since the plate 2 is disposed perpendicular to the base 91 and in parallel with the bobbin 95, the capacitance which is generated due to a finishing end part C of the coil 93 disposed close to or in contact with a beginning of the coil 93 changes to $C_1X_1$ and $C_2X_1$, as described later. Similarly, the capacitance which is generated due to a finishing end part C of the coil 94 disposed close to or in contact with a beginning of the coil 94 changes to $C_1Y_1$ and $C_2Y_1$.

FIG. 3 shows an electrical equivalent circuit of an arrangement in FIG. 2. As clear from FIG. 3, the capacitances $C_1X_1$ and $C_2X_1$ are connected in parallel to the coil 93 so as to be added to both ends of the coil 93. The same shall apply to the coil 94.

Figure 12:
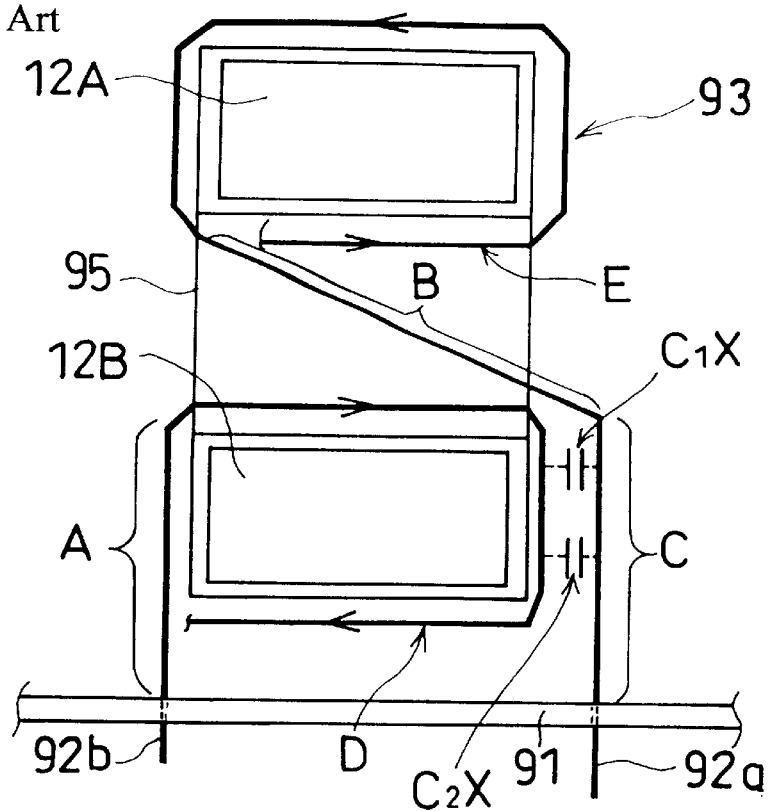
FIG. 12 is a sectional view for explaining problems in the conventional toroidal common mode choke coil of vertical type.
Figure 13:
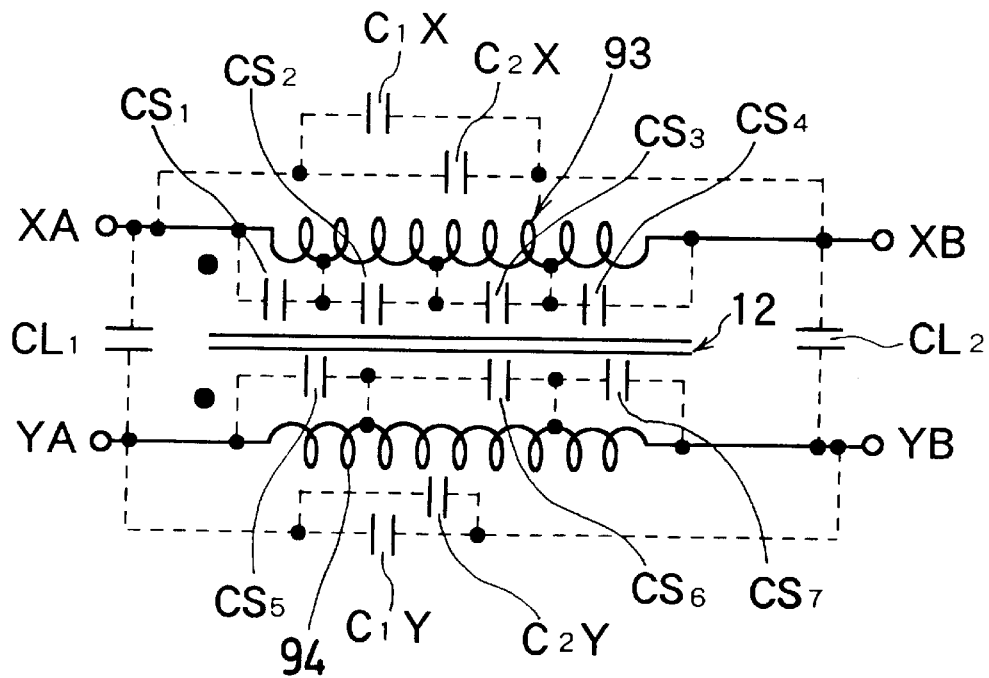
FIG. 13 shows an electrical equivalent circuit of the arrangement in FIG. 12.

Such a circuit has high-frequency characteristics different from those shown in FIG. 12. Specifically, the distance between the plate 2 and the beginning of the coil 93 facing the plate 2 can be arbitrarily set, and the distance between the finishing end part C of the coil 93 and the plate 2 can also be arbitrarily set. Accordingly, the distance between the beginning of the coil 93 and the finishing end part thereof can be sufficiently larger compared with when the finishing end part C of the coil 93 is disposed close to or in contact with the beginning of the coil 93 without the plate 2. For example, when it is assumed that the plate 2 is not provided and the distance between the beginning of the coil 93 and the finishing end part C of the coil 93 is 0.1 mm while the plate 2 with a thickness of 2 mm is provided, the distance between the plate 2 and the finishing end part C of the coil 93 is 1 mm, and the distance between the plate 2 and the beginning of the coil 93 positioned on the inside thereof is 1 mm, then the whole distance between the beginning of the coil 93 and the finishing end thereof can be 40 times as large as the distance therebetween defined without providing the plate 2. The plate 2 is formed of an insulating material having a lower dielectric constant than that of the bobbin 95, such as polyethylene telephthalate, and either the thickness thereof or the distances between the plate 2 and respective coil portions is increased so as to decrease the capacitances $C_1X_1$ and $C_2X_1$, thereby increasing capacitive impedances.

FIGS. 4A and 4B, FIGS. 5A and 5B, and FIGS. 7A and 7B show other embodiments of a toroidal common mode choke coil of vertical type according to the present invention. FIGS. 6A and 6B show an embodiment of a toroidal common mode choke coil of horizontal type according to the present invention. Each embodiment will be described hereinbelow with reference to the drawings.

Figure 4A:
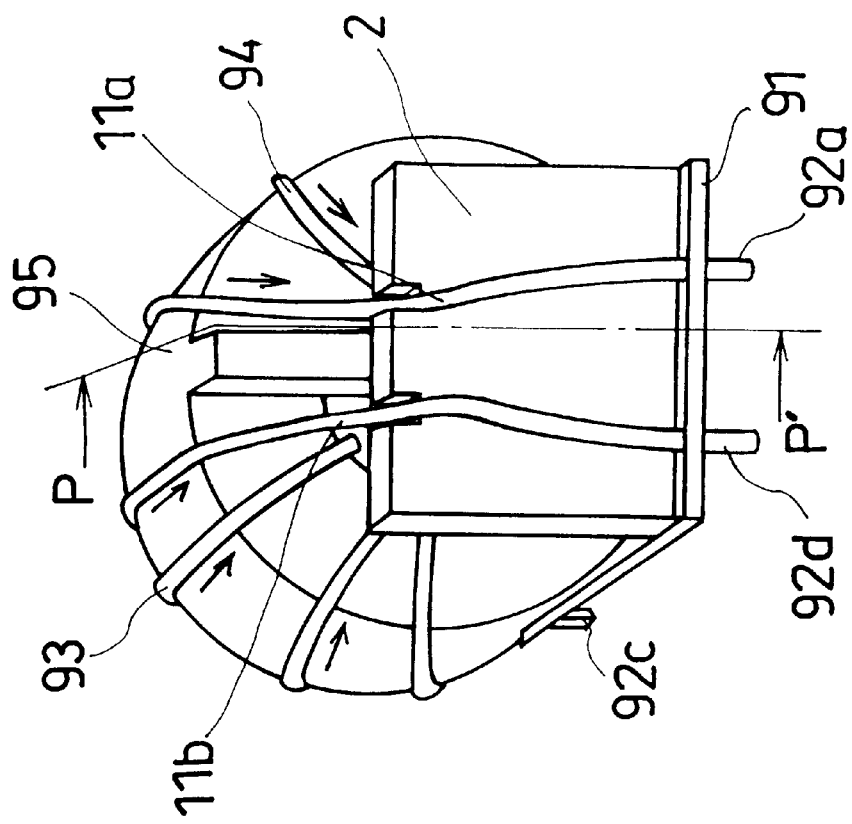
FIGS. 4A and 4B show another embodiment in which the way of winding a coil is different from that shown in FIGS. 1A and 1B.
Figure 4B:
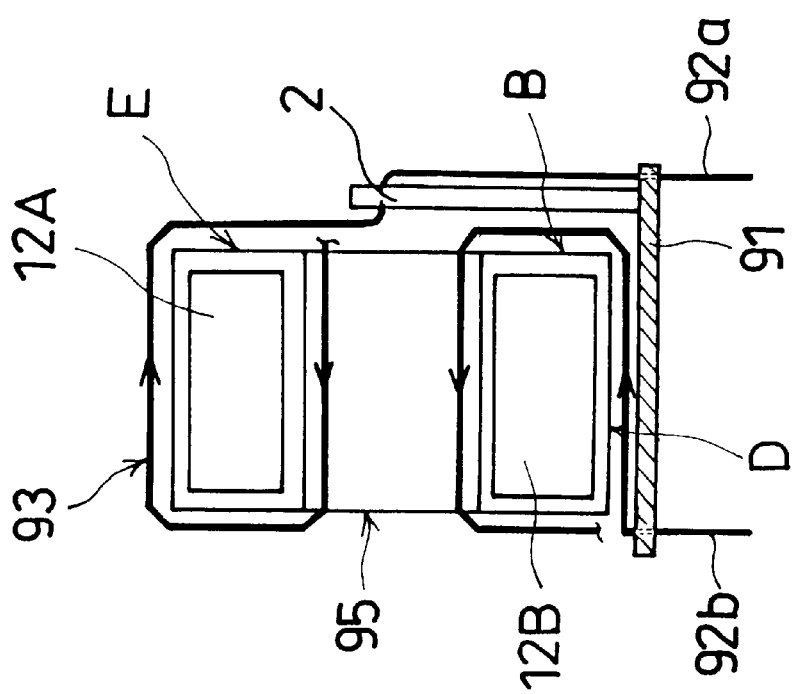

FIGS. 4A and 4B show another embodiment in which the way of winding the coils is different from that in the embodiment shown in FIG. 1. FIG. 4A is a perspective view thereof. FIG. 4B is a sectional view of FIG. 4A taken on line P–P' for explaining the relationship between the coil 93 and the bobbin 95. Since the configuration in FIG. 4A is identical to that in FIG. 1A except of the way of winding the coils, a description thereof will be omitted. FIG. 4B shows the configuration in FIG. 4A in a simplified form for a better clarification. In FIG. 4B, one end of the coil 93 is connected to the terminal 92*b* provided on the base 91 located under the bobbin 95, that is, toward the part 12B, and the coil 93 starts from a part D and is wound around the one half of the bobbin 95. The coil 93 finishes at an upper part of the bobbin 95, that is, at an outer face E of the part 12A, leads out toward the terminal 92*a* provided on the base 91 travelling along the outer face of the plate 2 mounted near a part B of the bobbin 95, and is connected to the terminal 92*a*.

The one end of the coil 93 wound around the one half of the bobbin 95 leads out from a part E toward the part B without passing through the center opening of the bobbin 95. Accordingly, even in a common mode choke coil with a small number of turns, an accurate inductive capacity can be obtained and the noise generated from the coil can be decreased because there is no coil passing through the center opening of the bobbin 95.

Figure 5A:
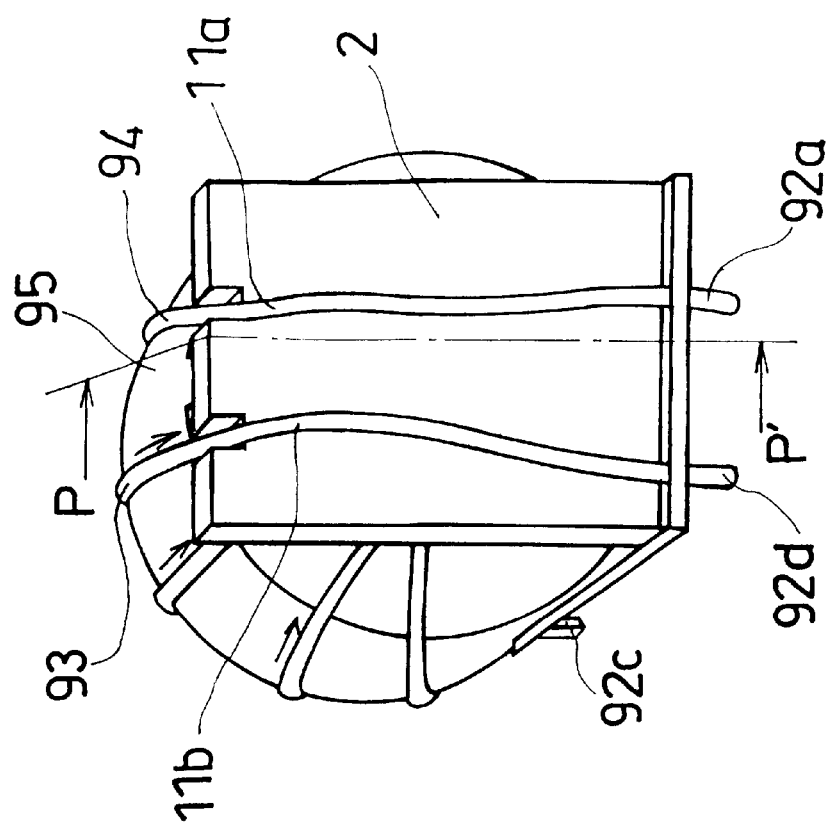
FIGS. 5A and 5B show another embodiment in which the shape of a plate is different from that shown in FIGS. 4A and 4B.
Figure 5B:
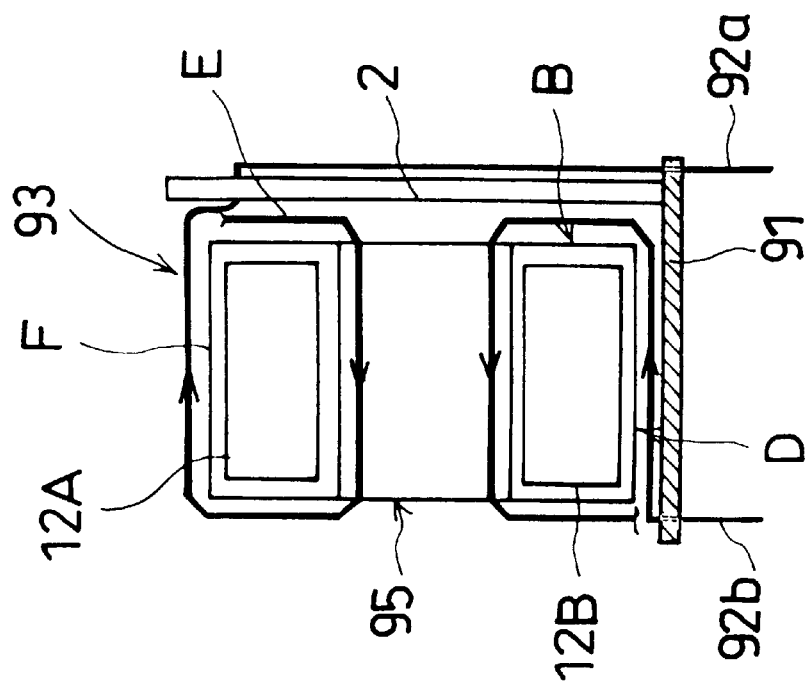
Figure 6A:
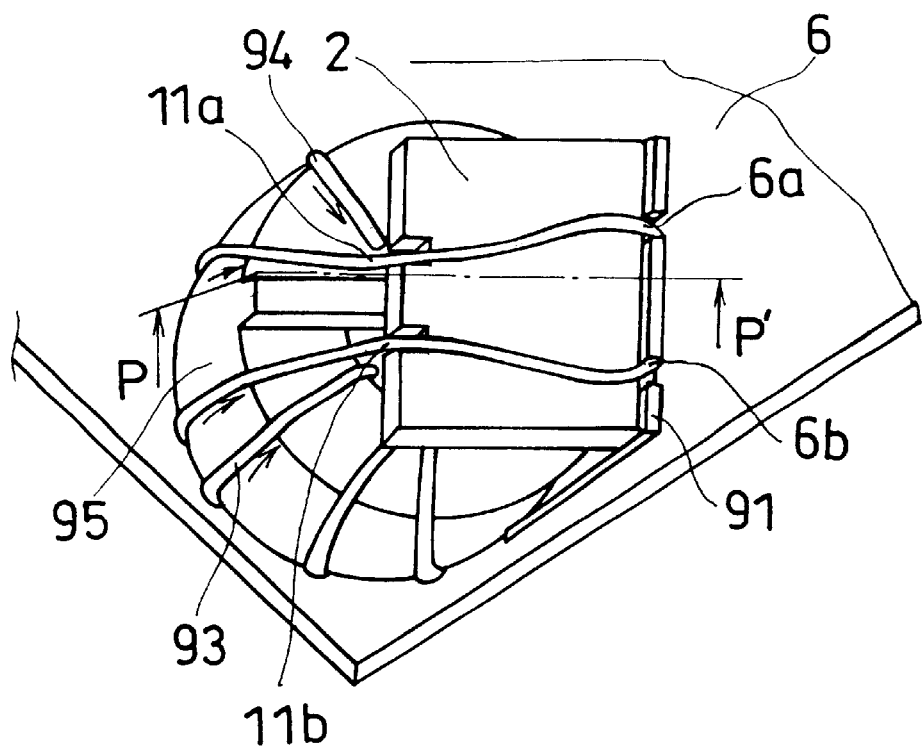
FIGS. 6A and 6B show another embodiment in which an input coil and an output coil cannot be disposed so as to oppose each other in a toroidal common mode choke coil of horizontal type.
Figure 6B:
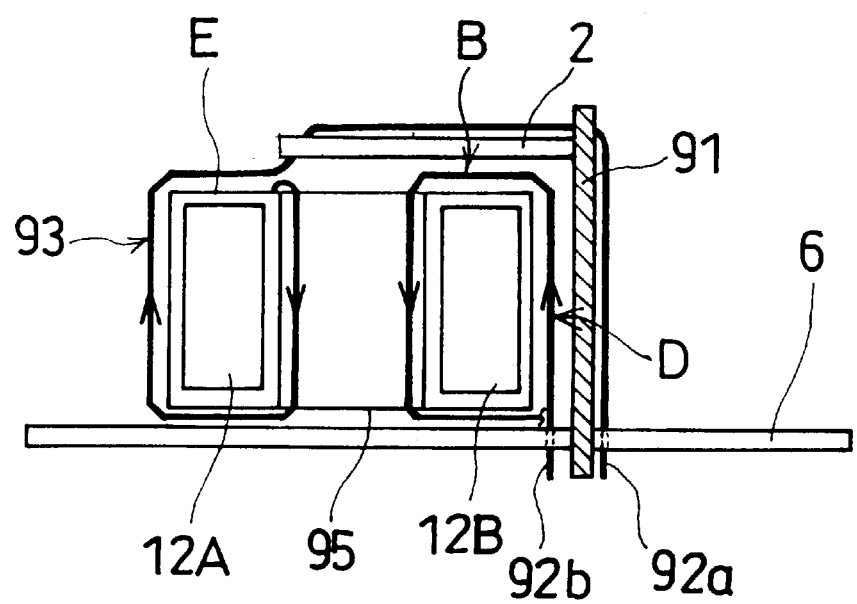

FIGS. 5A and 5B show still another embodiment in which the shape of the plate 2 is different from that in the embodiment shown in FIGS. 4A and 4B. FIG. 5A is a perspective view thereof and FIG. 5B is a sectional view taken on line P–P' of FIG. 5A for explaining the relationship between the coil 93 and the bobbin 95. Since the configuration in FIG. 5A is identical to that in FIG. 4A except that the shape of the plate 2 is different, a description thereof will be omitted. FIG. 5B shows the configuration in FIG. 5A in a simplified form for a better clarification. In FIG. 5B, the plate 2 is vertically mounted on the base 91 and has a height covering from the upper part of the bobbin 95, that is, from a part F to a position where the one end of the coil 93 leads out. With such an arrangement, the end of the coil 93 can reach the terminal 92*a* without being bent on the way as shown in FIG. 4B.

Needless to say, the shape of the plate 2 may be different from that described in the above embodiments as long as the notches 11*a* and 11*b* for fixedly holding the end parts of the coils are provided. For example, it is possible that the plate 2 is divided in two, one having the notch 11*a* and the other having the notch 11*b*, alternatively, the plate 2 may be replaced with a prop or the like having notches.

Figure 10:
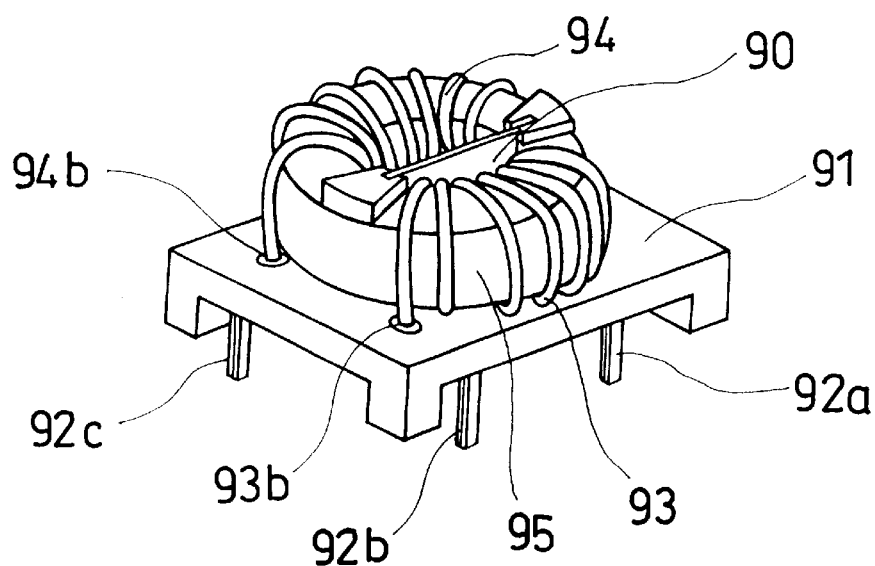
FIG. 10 is a perspective view of a conventional toroidal common mode choke coil of horizontal type.
Figure 11:
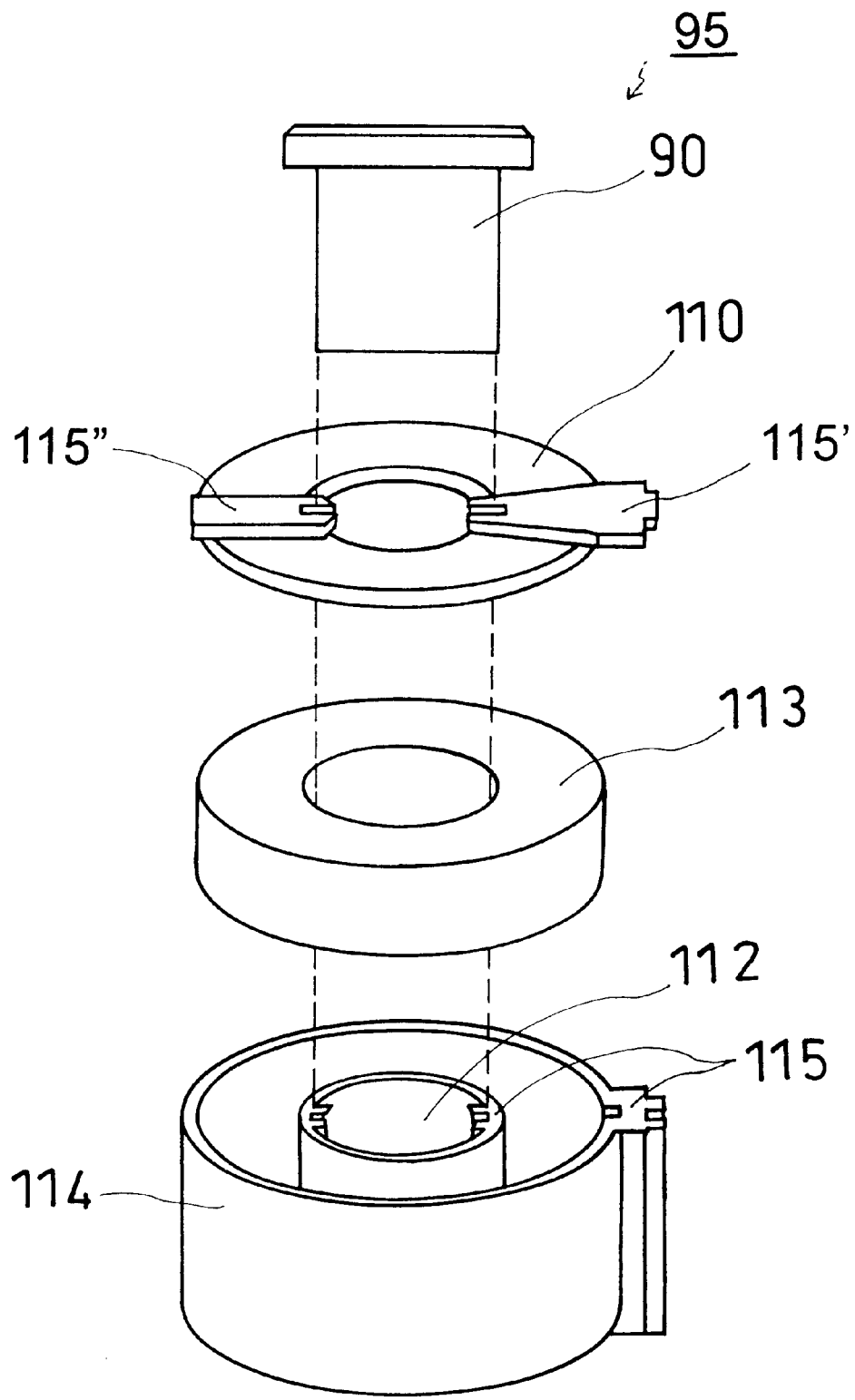
FIG. 11 is an exploded view of a bobbin.

Since the toroidal common mode choke coil of horizontal type can be arranged as shown in FIG. 10, the problem that the performance lowers at high frequencies, which results from the capacitance generated due to the finishing end part C of the coil 93 positioned close to or in contact with the beginning of the coil 93, can be prevented. However, in some printed-circuit boards for mounting the common mode choke coil, the input coil and the output coil cannot be arranged as shown in FIG. 10.

FIGS. 6A and 6B show an embodiment according to the present invention to solve the above difficulty. FIG. 6A is a perspective view thereof and FIG. 6B is a sectional view taken on line P–P' of FIG. 6A for explaining the relationship between the coil 93 and the bobbin 95. In FIG. 6A, the toroidal common mode choke coil is horizontally arranged on a printed-circuit board 6. In the configuration in FIG. 6A, the choke coil is horizontally arranged and the plate 2 is mounted on the bobbin 95. The plate 2 is integrally formed with the base 91 which is vertically mounted on the printed-circuit board 6.

The plate 2 integrally formed has the notches 11*a* and 11*b* and the base 91 has notches 6*a* and 6*b* for fixedly holding the end parts of the coils.

FIG. 6B shows the configuration in FIG. 6A in a simplified form for a better clarification. In FIG. 6B, the finishing end of the coil 93 is connected to the terminal 92*b* provided on the printed-circuit board 6 located under the bobbin 95 and the coil 93 starts from a part D and is wound around the one half of the bobbin 95. The coil 93 finishes at the upper part of the bobbin 95, that is, at a part E, leads out toward the terminal 92*a* provided on the printed-circuit board 6 travelling along the outer face of the plate 2 and the base 91, and is connected to the terminal 92*a*.

In such an arrangement similar to the case shown in FIGS. 4A and 4B, even in a toroidal common mode choke coil of horizontal type which cannot be arranged as shown in FIG. 10, the performance is prevented from lowering at high frequencies, which is caused by the capacitance generated due to the finishing end part C of the coil 93 positioned close to or in contact with the beginning of the coil 93.

Figure 7A:
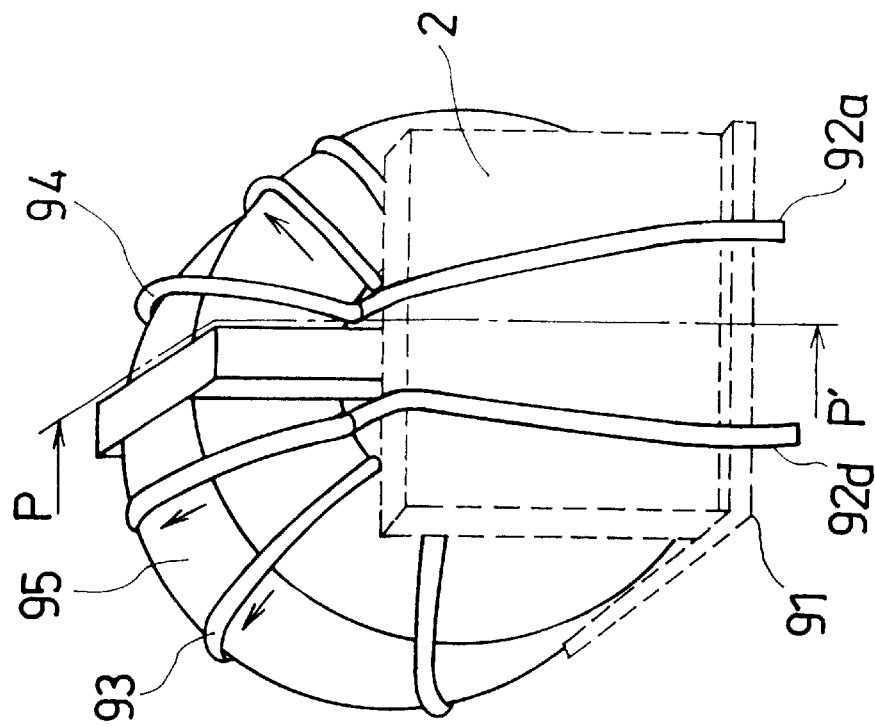
FIGS. 7A and 7B show another embodiment in which the configuration can be maintained even without a plate.
Figure 7B:
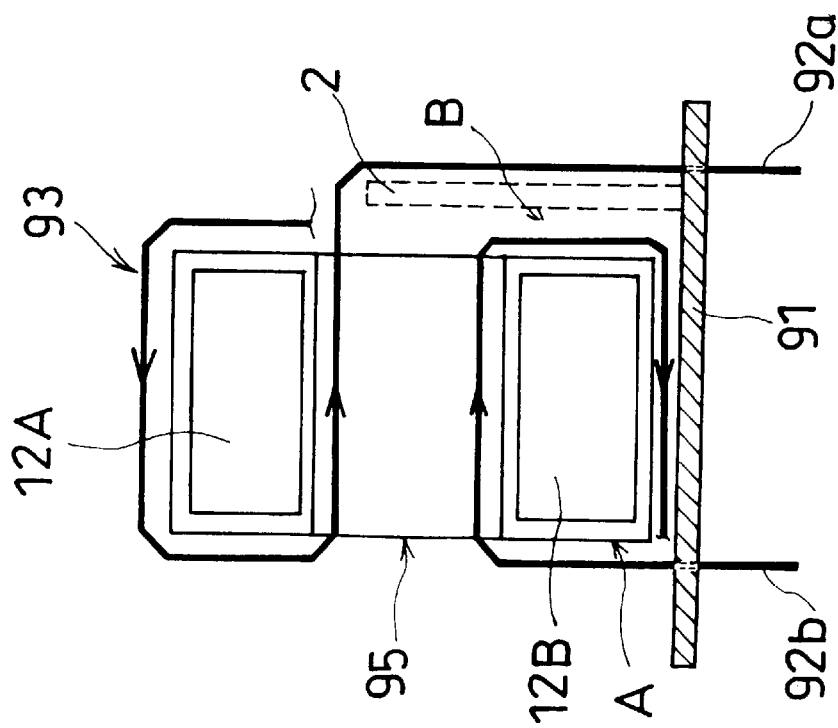

FIGS. 7A and 7B show still another embodiment, which applies to a case in which the coils 93 and 94 are firm and the shapes thereof can be maintained even without the plate 2. FIG. 7A is a perspective view thereof and FIG. 7B is a sectional view taken on line P–P' of FIG. 7A for explaining the relationship between the coil 93 and the bobbin 95. Since FIGS. 7A and 7B are identical to FIGS. 1A and 1B except that there is no plate 2 in the embodiment of FIGS. 7A and 7B, a description of the identical parts will be omitted.

FIG. 7B shows the configuration in FIG. 7A in a simplified form for a better clarification. In FIG. 7B, the finishing end of the coil 93 is connected to the terminal 92*b* provided on the base 91 located under the bobbin 95, that is, toward the part 12B, and the coil 93 starts from the part A and is wound around the one half of the bobbin 95. The coil 93 finishes at the upper part of the bobbin 95, that is, the end of the inner circumference at the part 12A, leads out toward the terminal 92*a* provided on the base 91 at a predetermined distance (a distance at which a capacitance is generated which can be ignored relative to the line voltage between the coils 93 and 94) apart from the part B, and is connected to the terminal 92*a*. Dashed lines in FIGS. 7A and 7B indicate a position where the plate 2 exists in case of FIGS. 1A and 1B, though the plate is not actually mounted on the base 91 in case of FIGS. 7A and 7B.

As described above, the finishing end of the coil 94 leads out toward the terminal 92*a* provided on the base 91 keeping a predetermined distance apart from the part B of the bobbin 95, thus a problem that the performance lowers at high frequencies can be resolved.

EXAMPLE

An example of the configuration shown in FIG. 1 will be described hereinbelow. A toroidal core (a Ni—Zn ferrite core having an initial magnetic permeability of 750) having an outside diameter of 25 mm, an inside diameter of 15 mm and a height of 13 mm is put into a bobbin. One copper wire having a diameter of 0.8 mm is wound around one half of the bobbin and another copper wire is wound around the other half thereof equally with 15 turns, respectively, so that the magnetic fluxes cancel out each other relative to a normal-mode current.

Figure 8:
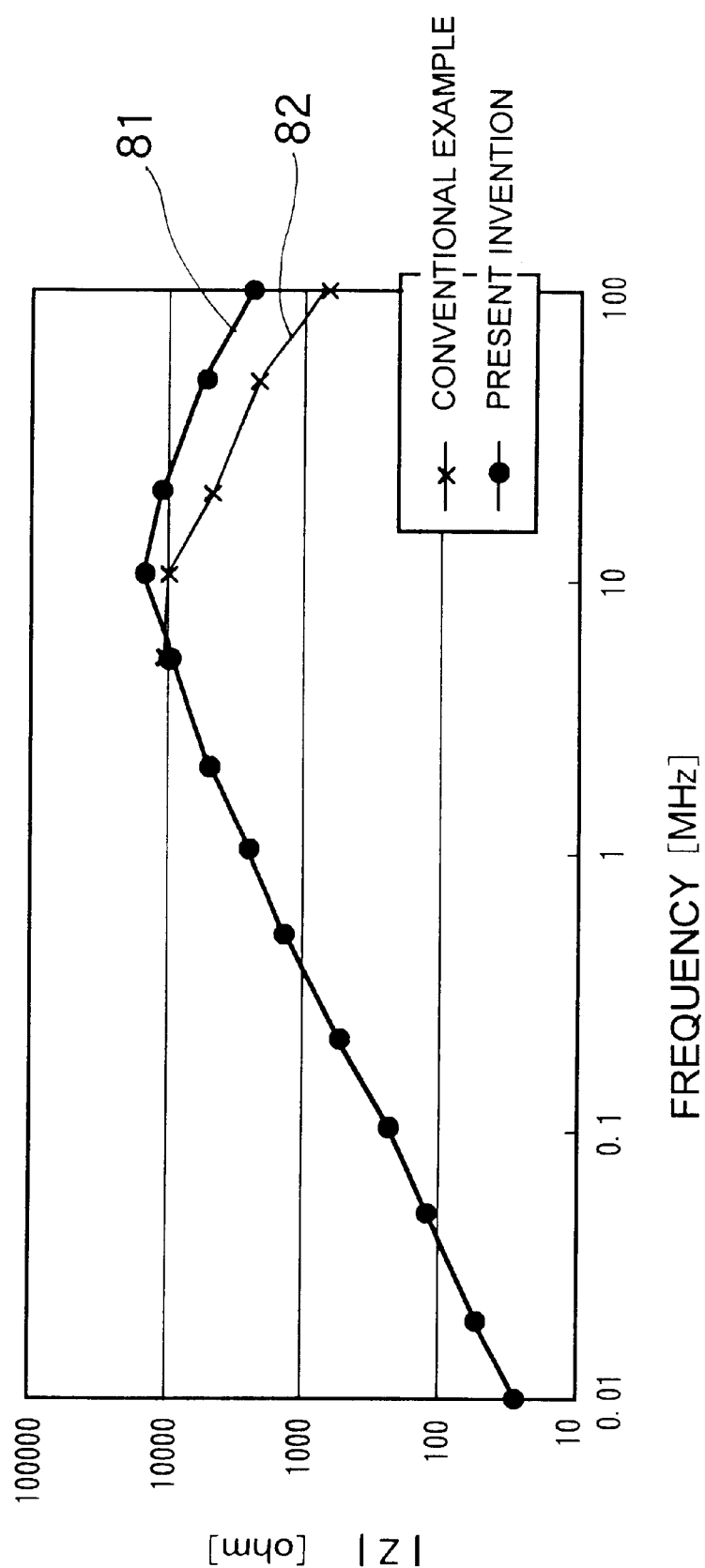
FIG. 8 shows a result of comparison of the frequency characteristics of toroidal common mode choke coils of vertical type between an example according to the present invention and a conventional example.
Figure 9:
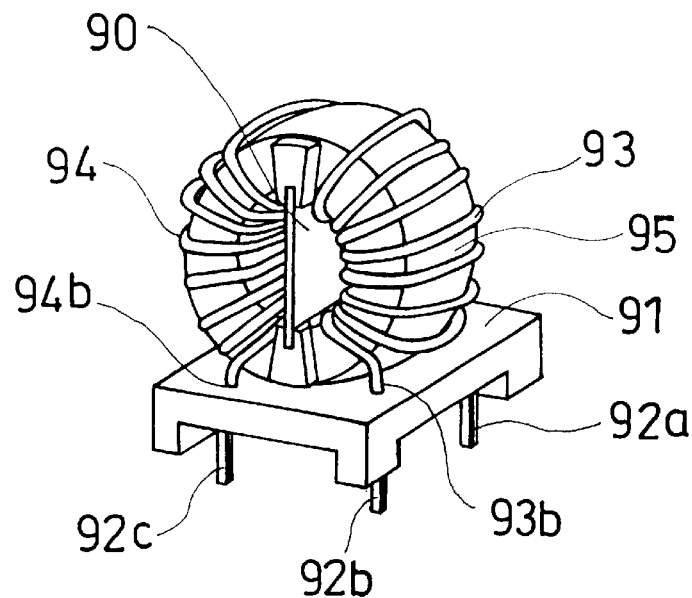
FIG. 9 is a perspective view of a conventional toroidal common mode choke coil of vertical type.

FIG. 8 shows a result of the frequency characteristics in the vertical type of toroidal common mode choke coil compared between the example according to the present invention and the conventional example. In FIG. 8, reference numeral 82 shows the result of the conventional example, and reference numeral 81 indicates the result of the example according to the present invention. In the conventional toroidal common mode choke coil of vertical type, when the frequency exceeds 10 MHz, impedance ZAB between both connection terminals starts decreasing and goes down to about 800 Ω at a frequency of 100 MHz. However, according to the example of the present invention, the impedance is about 3 kΩ even at a frequency of 100 MHz, which shows the impedance of the present invention is approximately 4 times as large as that of the conventional example and that the present invention is very effective.

According to the present invention, in a common mode choke coil in which one coil is wound around one half of a toroidal core housed in a bobbin and another coil is wound around the other half thereof such that the both coils are wound equally so that respective magnetic fluxes cancel out each other relative to a normal mode current, and in which one end part of each of the coils wound around respective halves of the core leads out toward a portion of the bobbin where the other end part thereof is wound, the one end part may be disposed so as not to stay close to the portion of the bobbin where the other end part is wound, thereby improving the characteristics at high frequencies.

In the common mode choke coil, the one end part of the coil may pass through a center opening of the core in a non-diagonal manner when travelling from one end face of the bobbin to the other end face thereof. Accordingly, an accurate inductive capacity can be obtained even in a common mode choke coil having a small number of turns, and at the same time the noise generated from the coil can be decreased.

In the common mode choke coil, a plate composed of an insulating material may be provided between the one end parts and the coils including the other end parts. Consequently, the withstand voltage between the input terminal and the output terminal can be increased and the characteristics at high frequencies can also be improved.

In the common mode choke coil, the plate may be provided with a plurality of notches each for fixedly holding the one end part of each of the coils. Consequently, even a flexible wire can be fixedly arranged, causing no change in capacitance, thereby improving the characteristics at high frequencies.

In the common mode choke coil, the plate may be formed of a same insulating material as that of a base on which the common mode choke coil is mounted, and integrated with the base. Thus, manufacturing can be simplified, and at the same time the withstand voltage can be improved and the characteristics at high frequencies can be improved with a simple configuration.

In the common mode choke coil, the plate and the base, which are integrated with each other, may be each provided with a plurality of notches for fixedly holding the terminal ends of the coils. Accordingly, manufacturing can be simplified, the withstand voltage can be increased, and even a flexible wire can be fixedly arranged, causing no change in capacitance, thereby improving the characteristics at high frequencies.

In the common mode choke coil, the plate may be provided with a plurality of notches each for fixedly holding the one end part of each of the coils and the base may be provided with a plurality of terminals. Consequently, it can be easily mounted on a printed circuit board or the like.

What is claimed is:

1. A common mode choke coil, in which one coil is wound around one half of a toroidal core housed in a bobbin mounted on a base and another coil is wound around the other half thereof such that the both coils are wound equally so that respective magnetic fluxes cancel out each other relative to a normal mode current, and in which one end part of each of the coils is wound around respective halves of the core leading out toward a portion of the bobbin where the other end part thereof is wound, the base including a plurality of terminals, a plate formed of an insulating material being vertically integrated with the base between the bobbin and the terminals, each coil starting from an outer face of the bobbin, being wound around one half of the bobbin, finishing at an outer face of the bobbin and connecting to one of the terminals through an outer face of the plate, and the one end part being disposed so as to not stay close to the portion of the bobbin where the other end part is wound.

2. A common mode choke coil according to claim 1, wherein the one end part of the coil passes through a center opening of the core in a non-diagonal manner when travelling from one end face of the bobbin to the other end face thereof.

3. A common mode choke coil according to claim 2, wherein a plate formed of an insulating material is provided between the one end parts of the coils and the coils including the other end parts.

4. A common mode choke coil according to claim 1, wherein the plate is provided with a plurality of notches each for fixedly holding the one end part of each of the coils.

5. A common mode choke coil according to claim 4, wherein the plate and the base, which are integrated with each other, are each provided with a plurality of notches each for fixedly holding the one end part of each of the coils.

6. A common mode choke coil according to claim 4, wherein the plate is provided with a plurality of notches each for fixedly holding the one end part of each of the coils, and the base is provided with a plurality of terminals.

7. A common mode choke coil according to claim 1, wherein the plate is formed of a same insulating material as that of the base.

8. A common mode choke coil according to claim 7, wherein the plate is formed of a same insulating material as that of a base on which the common mode choke coil is mounted, and integrated with the base.

9. A common mode choke coil according to claim 7, wherein the plate is provided with a plurality of notches each for fixedly holding the one end part of each of the coils, and the base is provided with a plurality of terminals.

* * * * *